US009954555B2

United States Patent
Voutilainen (10) Patent No.: US 9,954,555 B2
(45) Date of Patent: Apr. 24, 2018

(54) METHOD AND APPARATUS FOR SELECTIVE ERROR CORRECTION CODING

(71) Applicant: Provenance Asset Group LLC, Essex, CT (US)

(72) Inventor: Martti Voutilainen, Espoo (FI)

(73) Assignee: Provenance Asset Group LLC, Essex, CT (US)

( * ) Notice: Subject to any disclaimer, the term of this patent is extended or adjusted under 35 U.S.C. 154(b) by 91 days.

(21) Appl. No.: 14/653,093

(22) PCT Filed: Dec. 18, 2012

(86) PCT No.: PCT/FI2012/051258
§ 371 (c)(1),
(2) Date: Jun. 17, 2015

(87) PCT Pub. No.: WO2014/096503
PCT Pub. Date: Jun. 26, 2014

(65) Prior Publication Data
US 2015/0333772 A1   Nov. 19, 2015

(51) Int. Cl.
*H03M 13/29* (2006.01)
*H04W 4/00* (2018.01)
(Continued)

(52) U.S. Cl.
CPC ......... *H03M 13/29* (2013.01); *H03M 13/356* (2013.01); *H04L 1/007* (2013.01); *H04L 1/0072* (2013.01); *H04W 4/008* (2013.01)

(58) Field of Classification Search
CPC ..... H03M 13/29; H03M 13/356; H04L 1/007; H04L 1/0072; H04W 4/008
(Continued)

(56) References Cited

U.S. PATENT DOCUMENTS 6,807,648 B1 *  10/2004  Cansever ............ H04L 1/0041
  714/704
7,872,582 B1 *   1/2011  Diorio ................ G06K 7/0008
  340/10.1
(Continued)

FOREIGN PATENT DOCUMENTS

WO       2011135159        11/2011

OTHER PUBLICATIONS

International Search Report and Written Opinion received for corresponding Patent Cooperation Treaty Application No. PCT/FI2012/051258, dated Aug. 22, 2013, 12 pages.
(Continued)

*Primary Examiner* — John J Tabone, Jr.
(74) *Attorney, Agent, or Firm* — Dinsmore & Shohl LLP (57) ABSTRACT

A system including a wireless device configured to apply selective error correction coding to data content to produce first data and second data, wherein the first and the second data being error correction coded differently; maintain the first data and the second data in a non-volatile memory of the wireless device; receive an electromagnetic signal for powering the wireless device; and transmit the first data and the second data over a short-range wireless link. The system further includes an apparatus configured to transmit an electromagnetic signal for powering the wireless device; receive first and second data over a short-range wireless link, wherein the first data and the second data being error correction coded differently; and apply selective error correction decoding to the first data and the second data to produce data content.

12 Claims, 5 Drawing Sheets

(51) Int. Cl.
*H03M 13/35* (2006.01)
*H04L 1/00* (2006.01)

(58) Field of Classification Search
USPC ....... 714/773, 755, 763, 776, 752, 758, 704, 714/782, 784
See application file for complete search history.

(56) References Cited

U.S. PATENT DOCUMENTS

| | | | | |
|---|---|---|---|---|
| 8,044,774 | B1 * | 10/2011 | Diorio | G06K 7/0008 340/10.1 |
| 9,125,005 | B2 * | 9/2015 | Oksanen | H04W 76/023 |
| 2012/0244805 | A1 | 9/2012 | Haikonen et al. | |
| 2013/0171937 | A1 * | 7/2013 | Oksanen | H04W 76/023 455/41.2 |
| 2013/0198587 | A1 * | 8/2013 | Kim | G06F 11/1048 714/763 |
| 2015/0373486 | A1 * | 12/2015 | Oksanen | H04W 76/023 455/41.2 |

OTHER PUBLICATIONS

Robert Morelos-Aoragoza "Unequal error protection with CRC-16 bits in EPC class-1 generation-2 UHF RFID systems", Information Theory and Its Applications (ISITA), 2012 International Symposium on, IEEE, Oct. 28, 2012 pp. 36-40.
Rosnes E et al. "Coding for Inductively Coupled Channels", IEEE Transactions on Information Theory, IEEE Press USA, vol. 58, No. 8, Aug. 1, 2012, pp. 5418-5436.

* cited by examiner

METHOD AND APPARATUS FOR SELECTIVE ERROR CORRECTION CODING

RELATED APPLICATION

This application was originally filed as PCT Application No. PCT/FI2012/051258 filed Dec. 18, 2012.

TECHNICAL FIELD

The present invention relates generally to short-range communication system. The invention relates particularly, though not exclusively, to using selective error correction coding with a non-volatile memory of a wireless device.

BACKGROUND ART

Wireless short-range communication link, such as NFC or RFID may use radio frequency technology relating basically to the field of local communication technology and more particularly local communication technology involving electromagnetic and/or electrostatic coupling technology. Electromagnetic and/or electrostatic coupling is implemented in the radio frequency (RF) portion of the electromagnetic spectrum, using for example radio frequency identification (RFID) technology or near-field communication (NFC), which primarily includes radio frequency identification (RFID) transponders or near-field communication (NFC) transponders also denoted as radio frequency identification (RFID) tags or near-field communication (NFC) tags. Similarly, radio frequency identification (RFID) or near-field communication (NFC) reader interfaces for radio frequency transponders also denoted for simplicity as radio frequency identification (RFID) or near-field communication (NFC) readers.

Radio frequency identification (RFID) or near-field communication (NFC) technology is one of the recent arrivals in the terminal integration. Radio frequency identification (RFID) or near-field communication (NFC) communication enables new usage paradigms, e.g. pairing of devices, exchanging security keys, or obtaining product information by touching items provided with radio frequency identification (RFID) or near-field communication (NFC) tags with radio frequency identification (RFID) or near-field communication (NFC) communication enabled terminal. Typically, the operation range between the radio frequency identification (RFID) or near-field communication (NFC) tag and radio frequency identification (RFID) or near-field communication (NFC) reader interface in consumer applications is considered to be only a few centimeters.

There have been product releases in radio frequency identification (RFID) readers integrated in mobile apparatuses. The implementations are based on Near Field Communications (NFC) technology that operates on 13.56 MHz. The communication in that technology is obtained by inductive coupling and therefore it requires rather large coil antennas both in the reader and tag. Furthermore, inductive coupling has its limitations when it comes to the range of the radio connection.

The excitation power generated in a radio frequency identification (RFID) reader subsystem is reasonably high, from about 100 mW of consumer applications related to mobile terminal to several watts used in professional fixed applications. The used frequency allocations for UHF radio frequency identification (RFID) band are the 868 MHz ISM band in Europe and the 915 MHz band in United States. Obviously, the used frequencies are close to the used cellular frequencies, which are 880 MHz-915 MHz as well as 925 MHz-960 MHz in Europe and 824 MHz-849 MHz as well as 869 MHz-894 MHz in United States for mobile station cellular transmitter and receiver, respectively.

A local storage utilizing wireless short-range communication may be defined. Such storage concept, such as a Wireless Memory Tag (WMT), provides new environmentally friendly alternative to load especially local (but not limited to local) content from the WMT into mobile apparatuses, for example. An important differentiator to other information services is that no power consumption is required in the storage system composed by the WMT's. Only during a few second access session, some wireless power is transferred from a mobile apparatus into the WMT using Near Field Communication (NFC) power delivery capacity. The WMT may have storage capacity from 1 GB upwards, thus significantly more than in otherwise similar NFC RFID tags where there are only some kilobytes of information like URL-link address. The WMT may be independent system that does not require any cloud services but all information is comprised in the WMT's.

One of the challenges of the WMT system is to keep power consumption of a wirelessly powered memory tag, especially non-volatile memory read/write operating power, so low that the wirelessly transmitted power is enough for fast enough reading or writing content from/to the WMT. Thus, a solution is needed for an improved power consumption solution for a short-range wirelessly powered memory tag.

SUMMARY

According to a first example aspect of the invention there is provided a wireless device comprising:
- a communication interface configured to transceive signals with an apparatus;
- a processor;
- a memory including computer program code;
- the memory and the computer program code configured to, with the processor, cause the wireless device to:
- apply selective error correction coding to data content to produce first data and second data, wherein the first data and the second data being error correction coded differently;
- maintain the first data and the second data in a non-volatile memory of the wireless device;
- receive an electromagnetic signal for powering the wireless device; and
- transmit the first data and the second data over a short-range wireless link.

In an embodiment, the wireless device comprises a passive wireless memory tag.

In an embodiment, the non-volatile memory comprises a flash memory.

According to a second example aspect of the invention there is provided a method comprising:
- applying selective error correction coding to data content to produce first data and second data, wherein the first data and the second data being error correction coded differently;
- maintaining the first data and the second data in a non-volatile memory of the wireless device;
- receiving an electromagnetic signal for powering the wireless device; and
- transmitting the first data and the second data over a short-range wireless link.

In an embodiment, the first data being encoded using a first unequal error protection code.

In an embodiment, the second data being encoded using a second unequal error protection code.

In an embodiment, the second data not being encoded using an error protection code.

In an embodiment, the first data comprises control data.

In an embodiment, the second data comprises payload data.

In an embodiment, the control data comprises at least one of the following:
control data relating to associated payload data;
identification information for the wireless device or an apparatus;
wireless channel state information;
power control information;
scheduling information;
packet header information;
setup information for the short-range wireless link;
powering information for the wireless device;
error coding information; and
compression information.

In an embodiment, the payload data comprises at least one of the following:
video data;
image data; and
audio data.

According to a third example aspect of the invention there is provided a computer program embodied on a computer readable medium comprising computer executable program code which, when executed by at least one controller of a wireless device, causes the wireless device to:
apply selective error correction coding to data content to produce first data and second data, wherein the first and the second data being error correction coded differently;
maintain the first data and the second data in a non-volatile memory of the wireless device;
receive an electromagnetic signal for powering the wireless device; and
transmit the first data and the second data over a short-range wireless link.

According to a fourth example aspect of the invention there is provided an apparatus comprising:
a communication interface configured to transceive signals with a wireless device;
a processor;
a memory including computer program code;
the memory and the computer program code configured to, with the processor, cause the apparatus to:
transmit an electromagnetic signal for powering the wireless device;
receive first data and second data over a short-range wireless link, wherein the first data and the second data being error correction coded differently; and
apply selective error correction decoding to the first data and the second data to produce data content.

In an embodiment, the memory and the computer program code further configured to, with the processor, cause the apparatus to:
apply error correction coding using an error protection code to the second data.

In an embodiment, the memory and the computer program code further configured to, with the processor, cause the apparatus to:
maintain the data content in a memory of the apparatus.

According to a fifth example aspect of the invention there is provided a method comprising:
transmitting, by an apparatus, an electromagnetic signal for powering a wireless device;
receiving first data and second data over a short-range wireless link, wherein the first data and the second data being error correction coded differently; and
applying selective error correction decoding to the first data and the second data to produce data content.

In an embodiment, the method further comprises:
applying error correction decoding using an error protection code to the first data to produce control data.

In an embodiment, the method further comprises:
determining the second data as payload data; and
merging the control data and the payload data to produce data content.

In an embodiment, the method further comprises:
applying error correction coding using an error protection code to the data content.

In an embodiment, the method further comprises:
maintaining the data content in a memory of the apparatus.

According to a sixth example aspect of the invention there is provided a computer program embodied on a computer readable medium comprising computer executable program code which, when executed by at least one controller of an apparatus, causes the apparatus to:
transmit an electromagnetic signal for powering the wireless device;
receive first data and second data over a short-range wireless link, wherein the first data and the second data being error correction coded differently; and
apply selective error correction decoding to the first data and the second data to produce data content.

According to a seventh example aspect of the invention there is provided a system comprising:
a wireless device configured to:
apply selective error correction coding to data content to produce first data and second data, wherein the first data and the second data being error correction coded differently;
maintain the first data and the second data in a non-volatile memory of the wireless device;
receive an electromagnetic signal for powering the wireless device; and
transmit the first data and the second data over a short-range wireless link; and
an apparatus configured to:
transmit an electromagnetic signal for powering the wireless device;
receive first data and second data over a short-range wireless link, wherein the first data and the second data being error correction coded differently; and
apply selective error correction decoding to the first data and the second data to produce data content.

Any foregoing memory medium may comprise a digital data storage such as a data disc or diskette, optical storage, magnetic storage, holographic storage, opto-magnetic storage, solid state memory, phase-change memory, resistive random access memory, magnetic random access memory, solid-electrolyte memory, ferroelectric random access memory, organic memory or polymer memory. The memory medium may be formed into a device without other substantial functions than storing memory or it may be formed as part of a device with other functions, including but not limited to a memory of a computer, a chip set, and a sub assembly of an electronic device.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

The invention will be described, by way of example only, with reference to the accompanying drawings, in which.

DETAILED DESCRIPTION

In the following description, like numbers denote like elements.

Figure 1:
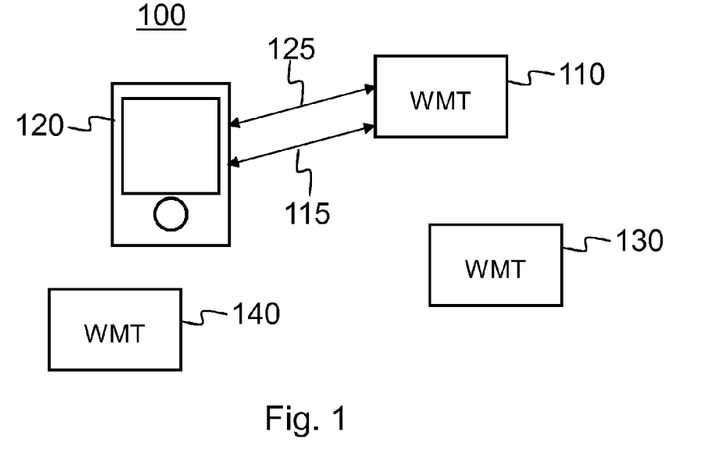
FIG. 1 shows some details of the system architecture in which various embodiments of the invention may be applied.

FIG. 1 shows some details of the system 100, in which various embodiments of the invention may be applied.

In an embodiment a wireless device, such as a wireless memory tag (WMT) 110, comprises user data, such as videos or photos. The wireless memory tag (WMT) 110 may utilize flash memories for storing the data, for example NAND or NOR flash memories. Using flash memory instead of NOR or PCM memory provides advantages, such as read/write operation speed that is faster for flash memory.

The wireless memory tag (WMT) 110 may be a passive device without dedicated powering but the tag 110 is powered by an external apparatus, such as a user apparatus 120, using a wireless power transfer link 125. The wireless power transfer link 125 may utilize en electromagnetic signal, for example. The user apparatus 120 may be also connected to the wireless memory tag 110 over a short-range wireless link 115. The short-range wireless link 115 provides data transfer between the apparatus 120 and the wireless memory tag 110. The system 100 may comprise a plurality of wireless memory tags 110, 130, 140.

Connection topology between a wireless device 110, such as a memory tag, and an apparatus 120 use point-to-point communication. The system 100 may be used for data transfer between an active wireless memory device, such as the memory subsystem in battery powered mobile apparatus 120, and a passive (without battery) wireless memory device 110, 130, 140 within few centimeters distance. The active wireless memory device 120 is able to provide wireless power to read and write wirelessly the passive wireless memory device 110, 130, 140.

Usage of a non-volatile memory, such as a flash memory, in the wireless memory tags 110, 130, 140 provides faster read and write times. However, the usage of error correction coding (ECC) increases power consumption in a wireless memory tag 110, 130, 140. Power consumption for a passive device like the memory tag 110, 130, 140 is challenging because the tag 110, 130, 140 has no dedicated power source but is powered by the apparatus 120 and thus consuming its battery or other power source. The power requirement of the tag 110, 130, 140 may either consume too much of the apparatus 120 power, or the power need exceeds the maximum power level the apparatus 120 is capable of providing over the wireless power link 125. Neither of these scenarios is acceptable.

In an embodiment, selective error correction coding is used for data content maintained in a non-volatile memory of a wireless device, such as a wireless memory tag. First data of the data content may be error correction coded (ECC) and second data of the data content may not be error correction coded (ECC). The transmission of the first and the second data over a wireless short-range link 115 between the wireless memory tag 110 and the apparatus 120 may utilize, for example, unequal error protection (UEP).

Figure 2A:
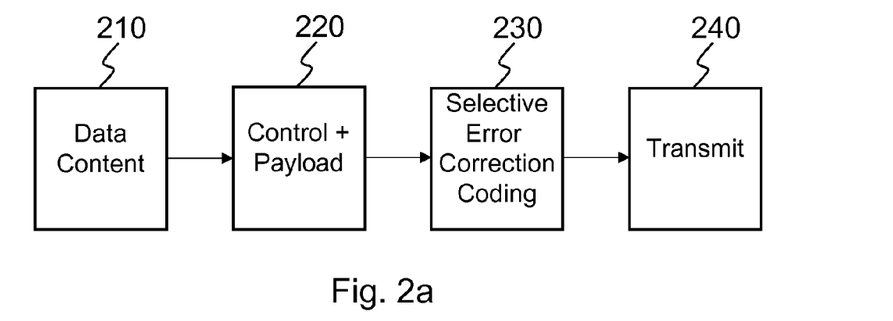
FIG. 2a shows a schematic view of operations in a wireless memory device, such as a wireless memory tag, in which various embodiments of the invention may be applied.

FIG. 2a shows a schematic view of operations in a wireless memory device 110, such as a wireless memory tag of FIG. 1, in which various embodiments of the invention may be applied.

In an embodiment, data content 210 is maintained in a wireless device, such as a wireless memory tag, wherein the tag comprises a non-volatile memory. The data content may comprise first data and second data. The first data may comprise control data and the second data may comprise payload data, for example, as shown in item 220. Different error correction coding may be been applied to the first and the second data using selective error correction coding 230. The first data may have been error correction coded (ECC) using a first code. The second data may not have been error correction coded (ECC) at all. Alternatively, the second data may have been error correction coded (ECC) using a second code that is lighter than the first code. The wireless memory tag is passive but receives an electromagnetic signal from an apparatus for powering the wireless device. The apparatus powering the wireless memory tag may request at least part of the data content 210 maintained in the non-volatile memory. Alternatively the wireless memory tag may push at least part of the data content 210 to the apparatus. The wireless memory tag determines first and second data 220 to be transmitted over a short-range wireless link to the apparatus. The first data may comprise control data and the second data may comprise payload data, for example, as shown in item 220 and the first and the second data may be coded differently as shown in item 230.

In an embodiment, the wireless device, such as the wireless memory tag, is configured to apply selective error correction coding 230 to the data content to produce first data and second data, wherein the first and the second data being coded differently. The first data, such as the control data, may be error correction coded to reduce errors in the data being transmitted. The second data, such as the payload data, may be maintained without error correction coding or alternatively may be error correction coded with different code, a lighter code. If the payload data comprises for example video stream, some minor errors in the payload data does not matter too much and may be allowable. Furthermore, receiving end video decoder may be tolerant for such errors. After the selective error correction coding 230, the maintained first and second data, such as the control and payload data, are transmitted 240 over a wireless short-range link for the apparatus.

Figure 2B:
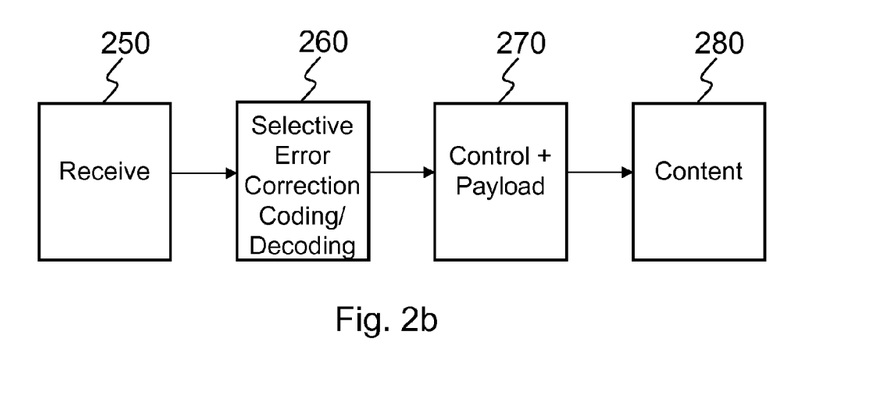
FIG. 2b shows a schematic view of operations in a user apparatus, in which various embodiments of the invention may be applied.

FIG. 2b shows a schematic view of operations in a user apparatus 120 of FIG. 1, in which various embodiments of the invention may be applied.

In an embodiment, the active apparatus provides an electromagnetic signal from the apparatus to the tag for powering the wireless device. After that, data is received from a wireless memory tag over a short-range wireless link by the apparatus. The received data may comprise first and second data, wherein the first data and the second data being error correction coded differently. The first and the second data may comprise data such as the control and payload data, respectively. The apparatus powering the wireless memory tag may request at least part of the data content 210 maintained in the non-volatile memory of the tag. Alternatively the wireless memory tag may push at least part of the data content 210 to the apparatus.

In an embodiment, the apparatus is configured to apply selective error correction decoding 260 to the received first and second data to produce decoded first data and second data, such as control data and payload 270. The received first and the second data may be decoded differently. The first data may have been error correction coded (ECC) by the transmitting tag using a first code. The second data may not have been error correction coded (ECC) at all. Alternatively, the second data may have been error correction coded (ECC) using a second code that is lighter than the first code. The first data, such as the control data, may be error correction decoded in item 260. The second data, such as the payload data, may be transmitted without error correction coding or decoded if the second code is being used in item 260. After the selective error correction coding/decoding 260, the first and the second data, such as the control and the payload data, may be maintained in a memory of the apparatus as shown in item 270. Based on the first and the second data the apparatus is provided with a desired content 280.

In an embodiment, the second data may be applied error correction coding in the receiving end in item 260 using an error protection code. Thus the processing of the second data error correction coding may be done in the apparatus instead of the wireless memory tag. The error correction coded (ECC) data, such as control and payload data 270 may be maintained in the apparatus for providing data content 280.

In an embodiment, the control data may relate to the associated payload being transmitted. Alternatively, the control data may relate to identification of the wireless device and the apparatus, channel state information, power control information, scheduling information, packet headers, setting up the short-range wireless link, powering the tag or configuring the communication, for example.

In a receiving apparatus, unequal error correction decoding methods may be used for compensating errors applied to corrupted encoded data. Furthermore, error correction coding (ECC) may be used only at the receiving side to correct corrupted data at the receiving apparatus.

Using selective error correction coding in the wireless memory tag for transmitted data has many advantages. Power is saved and usage of higher bit rates for the transfer is enabled. Furthermore, shorter loading time of content from the tag to the apparatus is provided.

In an embodiment, different power classes may be used for a wireless memory tag. Power classes may comprise at least following three classes: 20-50 mW, 50-100 mW, and 100-150 mW. Usage of error correction coding (ECC) for all data transmitted from the wireless memory tag to the apparatus would require a significant part of a power budget relating to the utilized power class. Especially when utilizing lower power classes, such problem is severe. However, utilizing selective error correction coding, such as unequal error protection (UEP), power consumption of a wireless memory tag is reduced.

In an embodiment, error correction coding (ECC) may be used at a wireless memory tag side for correcting control messages only, and other data may be maintained unencoded or using a lighter ECC code. Furthermore, the maintained data may be processed using unequal error protection (UEP). Alternatively, the error correction coding may be done totally at a receiving apparatus side.

Power consumption of a wireless memory tag, especially for non-volatile memory read/write operation, is so low that the wirelessly transmitted power is enough for fast enough reading or writing content from/to the tag. A maximum power class may be for example 100-150 mW for the wireless memory tag. Especially error handling requires significant part of the total power consumption of reading or writing of non-volatile memories, and problem is increasing with smaller CMOS geometries. To accommodate these trends, tradeoffs must be made in the error correction to balance correction capability with the amount of space available in a flash page for error correction coding (ECC) parity bytes. Moving to larger ECC correction blocks provides much more powerful correction capabilities while consuming a similar number of bytes for parity to that in a smaller block. Furthermore, devices may also use 8 kB page sizes and may require error correction of over 1 kB data blocks in order to minimize the number of spare bytes in a flash page. Controllers need to handle this larger page size and must be flexible enough to accommodate the vagaries in the ECC requirements and spare area size of flash parts.

Raw bit error rate (BER) typically refers to a probability of a bit error occurring in an individual bit cell, and is typically required to be $10^{-10}$-$10^{-12}$ in cable serial links, $10^{-3}$-$10^{-5}$ in short-range wireless links like a wireless memory radio link, and $10^{-11}$-$10^{-19}$ with flash devices. Typically a number of errors are defined to be acceptable based on application's sensitivity to losing a portion of data. A failure that results in data being lost may be called a block error and the rate of these failures may be called a block error rate (BLER). An error rate may be decided that is acceptable for the application and then provide enough redundancy in the error correction to provide this level of reliability. The error correction algorithms may be designed to meet the needs.

NAND flash-type non-volatile memories are typically intended for a general use and unnecessary high BER and BLER requirements of $10^{-11}$-$10^{-19}$ may be used. Such requirements correspond to power consumption that more power than can be wirelessly transmitted to the tag would be consumed for error correction code operation alone. This is why only some phase change memories (PCM/PRAM) or NOR flash memories of high capacity non-volatile memories can be used in wireless memory tags, but not NAND flash memories.

In an embodiment, some errors are selectively allowed in data stored in non-volatile memory of a wireless memory device, such as a wireless memory tag, depending on the nature of the data. All control characters are protected for errors by using efficient error correction code (ECC) and also if nature of the data requires absolute error-free handling. Most of the data to be read or written from/to the wireless memory tag may be, however, photographs or videos. Small errors, especially with video content, are not visible in typical consumer applications when watching the content. Thus there is no reduction in consumer quality experience of the content.

In an embodiment, data parts of the content in the wireless memory tag that are error correction coded may be configured. Control data and payload data may both be coded but with different coding. A heavier coding may be used for control data than for the payload data. Control data and some of the payload data may be coded and some of the payload data left unencoded. On option is that only control data such as control characters or messages may be error correction coded but rest of the data is not error correction coded.

In an embodiment, selective error correction coding/decoding may be applied for at least part of the data content. Furthermore, selective error correction coding/decoding may be applied in a wireless memory tag or an apparatus. Also some other parts of the data than control data may be error correction coded.

In an embodiment, packets may be lost in transmission between a wireless memory tag and an apparatus. In case data content transmitted comprises, for example, a video stream, such packet loss may result to reference frame mismatches between an encoder and a decoder. However, certain video decoders, such as H.264 AVC, are tolerant to these errors, if unequal error protection method is used. In this way no error correction code is needed to be done in a wireless memory tag for the payload data but all processing may be transferred to the active (battery-powered) apparatus.

In an embodiment, at least part of the data content may be neglected for error correction coding/decoding in the meaning of selective error correction coding. For example, in case the data content comprises photography data, such as images, each image may be represented using certain number of bits per pixel (bpp). Selective error correction coding may be applied only to most significant bits (MSB) of each pixel data and neglect least significant bits (LSB). Correspondingly, in the receiving end, for example at the apparatus, only the error correction coded MSB's are error correction decoded.

In an embodiment, unequal error protection (UEP) is used for data content to be transmitted from a passive wireless memory tag to an active apparatus. UEP is based on the fact that not all bits have the same importance. Thus more error protection may be used for more important bits over less important bits. To counter the effect of errors, forward error correction (FEC) codes may be used. The perceptual video quality may be affected by both the transmission channel errors and also by the compression. The video bit stream (e.g. H.264/AVC) stored in a non-volatile memory of the wireless memory tag may comprise high and low priority bits. The high priority bits are given more protection with unequal error protection using a heavier code and the low priority bits are given less protection before transmission. The low priority bits may be unencoded and stored in the non-volatile memory without error correction coding (ECC). The bit stream is then transmitted to the apparatus and recovered at the receiving apparatus side. Unequal error protection may be decoded for the high priority bits and also for the low priority bits if some lighter code has been used in transmitting end. After decoding the whole data content (bit stream) may be stored to the memory of the receiving apparatus and error correction coded (ECC) for the memory. The unequal error protection may comprise at least one of the following: Hierarchical QAM (H-QAM), forward error correction (FEC), priority encoding transmission, and adaptive slice grouping.

In an embodiment, data content is stored in a non-volatile memory of a wireless device, such as a wireless memory tag. The tag may be passive and wirelessly powered by a user apparatus. The data content may comprise first data and second data. The first data may be control data or other important data requiring improved error correction. The first data may be stored in the non-volatile memory using error correction coding (ECC). The second data may be payload data with lower importance. The second data may be stored in the non-volatile memory of the wireless device (WMT) without error correction coding (ECC). The first data and the second data may be transmitted to the user apparatus and the error correction coding (ECC) done there for the second data. Thus, significantly higher bit rates may be used and data content can be loaded in shorter time over a wireless short-range link between the wireless device and the user apparatus.

Figure 3:
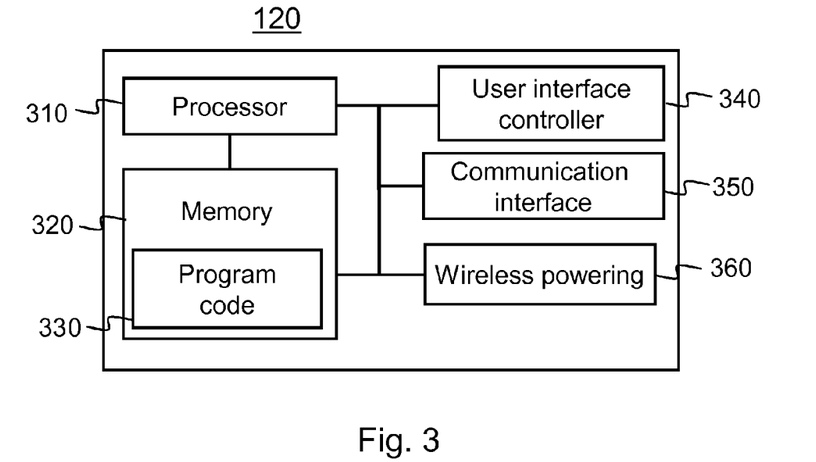
FIG. 3 presents an example block diagram of an apparatus in which various embodiments of the invention may be applied.

FIG. 3 presents an example block diagram of an apparatus 120 in which various embodiments of the invention may be applied. The apparatus 120 may be a user equipment (UE), user device or apparatus, such as a mobile terminal, a smart phone, a personal digital assistant (PDA), a laptop, a tablet or other communication device.

The general structure of the apparatus 120 comprises a user interface controller 340, a communication interface 350, a processor 310, and a memory 320 coupled to the processor 310. The apparatus 120 further comprises software 330 stored in the memory 320 and operable to be loaded into and executed in the processor 310. The software 330 may comprise one or more software modules and can be in the form of a computer program product. The apparatus 120 may further comprise a wireless powering element 360 for providing wirelessly power for a memory tag.

The wireless powering element 360 may also be integrated to another element of the apparatus 120, for example to the communication interface 350.

The processor 310 may be, e.g. a central processing unit (CPU), a microprocessor, a digital signal processor (DSP), a graphics processing unit, or the like. FIG. 3 shows one processor 310, but the apparatus 120 may comprise a plurality of processors.

The memory 320 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The apparatus 120 may comprise a plurality of memories. The memory 320 may be constructed as a part of the apparatus 120 or it may be inserted into a slot, port, or the like of the apparatus 120 by a user. The memory 320 may serve the sole purpose of storing data, or it may be constructed as a part of an apparatus serving other purposes, such as processing data. Received first and second data from the wireless memory tag, data content and error coding/decoding data may be stored to the memory 320.

The user interface controller 340 may comprise circuitry for receiving input from a user of the apparatus 120, e.g., via a keyboard, graphical user interface shown on the display of the user apparatus 120, speech recognition circuitry, or an accessory device, such as a headset, and for providing output to the user via, e.g., a graphical user interface or a loudspeaker.

The wireless powering element 360 is configured to provide power to the wireless memory tag. Wireless power transfer frequency may be 13.56 MHz. Different angles may be defined between the apparatus and the tag for optimized usage. For example, 0-45° angles between the power transmission antenna in apparatus 120 and the power receiving antenna in the wireless memory tag may be used. Wireless power transmitter and transmission antenna of powering element 360 and corresponding wireless power receiver and power receiving antenna in the tag may transfer with at least 20 mW dc-power available in tag with 30 mm distance between the geometrical centers of wireless power transfer antennas in the apparatus 120 and the tag. Different power classes may be used, such as 20-50 mW, 50-100 mW, and 100-150 mW.

The communication interface module 350 implements at least part of radio transmission. The communication interface module 350 may comprise, e.g., a wireless interface module. The wireless interface may comprise such as near field communication (NFC), a WLAN, Bluetooth, infrared (IR), radio frequency identification (RF ID), GSM/GPRS, CDMA, WCDMA, or LTE (Long Term Evolution) radio module. The communication interface module 350 may be integrated into the user apparatus 120, or into an adapter, card or the like that may be inserted into a suitable slot or port of the apparatus 120. The communication interface module 350 may support one radio interface technology or a plurality of technologies. The apparatus 120 may comprise a plurality of communication interface modules 350. Short-range wireless data, such as data content or first and second data may be transmitted to a wireless memory tag using the communication interface 350.

A skilled person appreciates that in addition to the elements shown in FIG. 3, the apparatus 120 may comprise other elements, such as microphones, displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like. Additionally, the apparatus 120 may comprise a disposable or rechargeable battery (not shown) for powering when external power if external power supply is not available.

Figure 4:
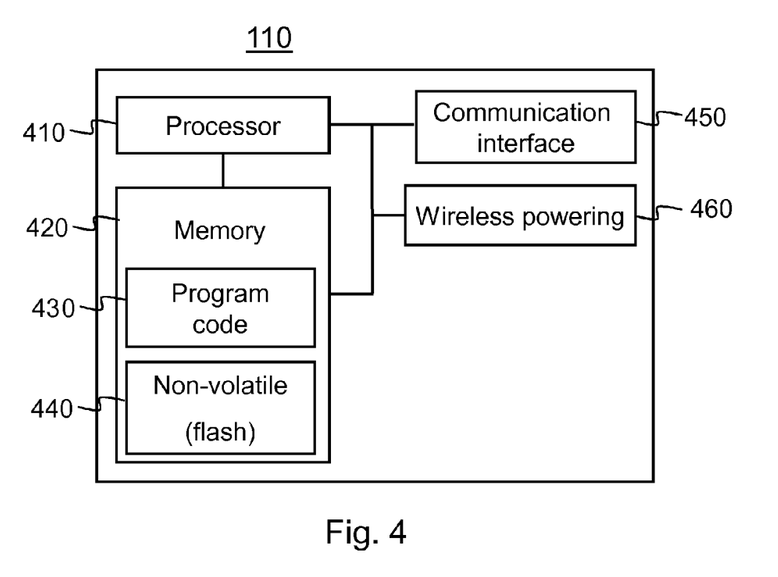
FIG. 4 presents an example block diagram of a wireless device, such as a wireless memory tag, in which various embodiments of the invention may be applied.

FIG. 4 presents an example block diagram of a wireless device 110, such as a wireless memory tag, in which various embodiments of the invention may be applied.

The general structure of the wireless device, such as the memory tag 110 comprises a processor 410, and a memory 420 coupled to the processor 410. The wireless device 110 further comprises software 430 stored in the memory 420 and operable to be loaded into and executed in the processor 410. The software 430 may comprise one or more software modules and can be in the form of a computer program product.

The processor 410 may be, e.g. a central processing unit (CPU), a microprocessor, a controller, or the like. FIG. 4 shows one processor 410, but the wireless device 110 may comprise a plurality of processors.

The memory 420 may be for example a non-volatile or a volatile memory, such as a read-only memory (ROM), a programmable read-only memory (PROM), erasable programmable read-only memory (EPROM), a random-access memory (RAM), a smart card, or the like. The memory comprises non-volatile memory 440, such as flash memory.

The flash memory may comprise NAND or NOR flash memory. The wireless device 110 may comprise a plurality of memories. The memory 420 may be constructed as a part of the device 110 or it may be inserted into a slot, port, or the like of the device 110 by a user. The memory 420 may serve the sole purpose of storing data, or it may be constructed as a part of a device serving other purposes, such as processing data.

The communication interface module 450 implements at least part of radio transmission. The communication interface module 450 may comprise, e.g., a wireless module. The wireless interface may comprise such as near field communication (NFC), a WLAN, Bluetooth, infrared (IR), radio frequency identification (RF ID), GSM/GPRS, CDMA, WCDMA, or LTE (Long Term Evolution) radio module. The communication interface module 450 may be integrated into the device 110, or into an adapter, card or the like that may be inserted into a suitable slot or port of the device 110. The communication interface module 450 may support one radio interface technology or a plurality of technologies. The device 110 may comprise a plurality of communication interface modules 450. Content data, first and second data and encoding/decoding data from the wireless memory tag 110 to the apparatus 120 may be transmitted using the communication interface 450.

The wireless powering element 460 is configured to receive power from the apparatus 120. Wireless power transfer frequency may be 13.56 MHz. Different angles may be defined between the apparatus 120 and the tag 110 for optimized usage. For example, 0-45° angles between the power transmission antenna in apparatus 120 and the power receiving antenna in the wireless memory tag 110 may be used. Wireless power receiver and receiving antenna of powering element in the powering element 460 may receive with at least 20 mW dc-power available in the tag 110 with 30 mm distance between the geometrical centers of wireless power transfer antennas of the apparatus 120 and the tag 110. Different power classes may be used, such as 20-50 mW, 50-100 mW, and 100-150 mW.

A skilled person appreciates that in addition to the elements shown in FIG. 4, the device 110 may comprise other elements, such as microphones, displays, as well as additional circuitry such as input/output (I/O) circuitry, memory chips, application-specific integrated circuits (ASIC), processing circuitry for specific purposes such as source coding/decoding circuitry, channel coding/decoding circuitry, ciphering/deciphering circuitry, and the like.

Figure 5:
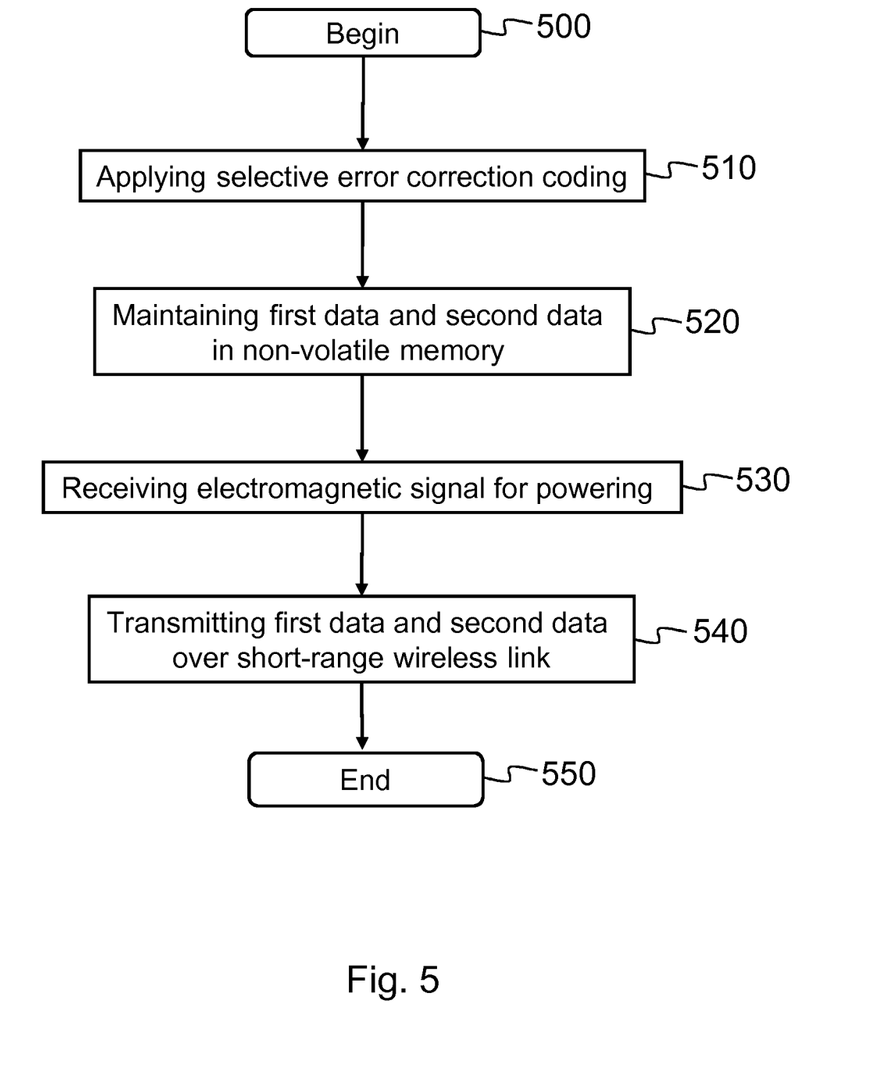
FIG. 5 shows a flow diagram showing operations in a wireless device, such as a wireless memory tag, in accordance with an example embodiment of the invention.

FIG. 5 shows a flow diagram showing operations in a wireless device in accordance with an example embodiment of the invention. In step 500, the method is started. In step 510, selective error correction coding is applied to data content to produce first data and second data, wherein the first data and the second data being coded differently. In step 520, the first data and the second data are maintained in a non-volatile memory of the wireless device. In step 530, an electromagnetic signal for powering is received by the wireless device. In step 540, transmitting the first data and the second data over a short-range wireless link. The method ends in step 550.

Figure 6:
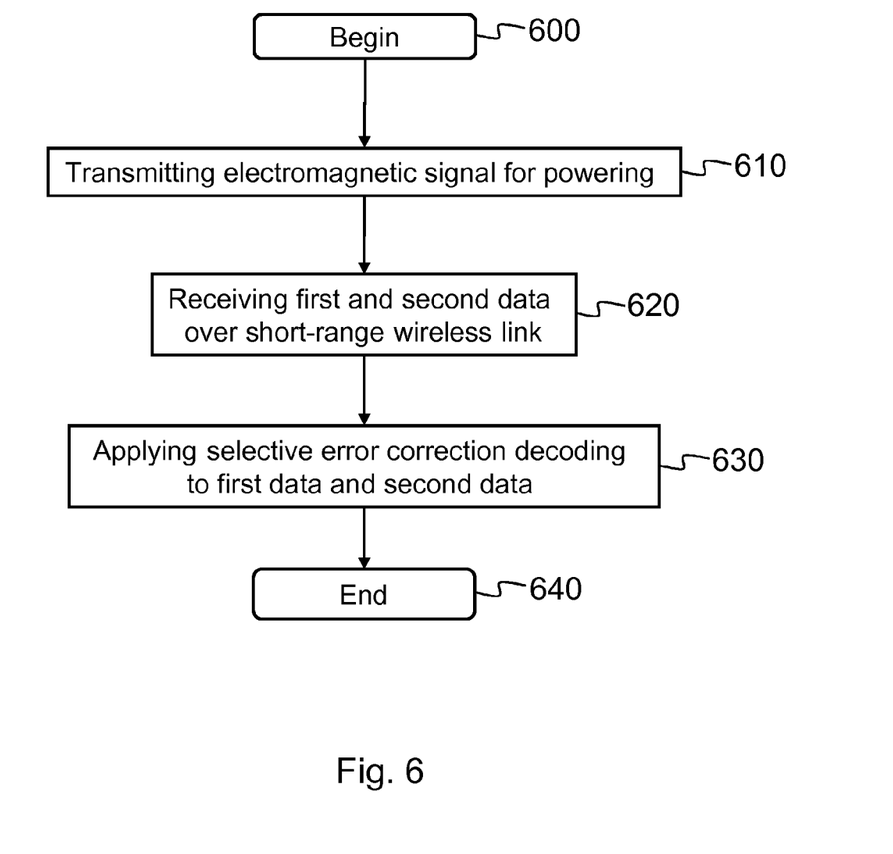
FIG. 6 shows a flow diagram showing operations in an apparatus, in accordance with an example embodiment of the invention.

FIG. 6 shows operations in an apparatus in accordance with an example embodiment of the invention.

In step 600, the method is started. In step 610, an electromagnetic signal is transmitted for powering a wireless device. In step 620, first and second data are received over a short-range wireless link, wherein the first and the second data being error correction coded differently. In step 630, selective error correction decoding is applied to the first data and the second data to produce data content. Alternatively in step 630, error correction coding is applied using an error protection code to the second data. In step 640, the method ends.

Figure 7:
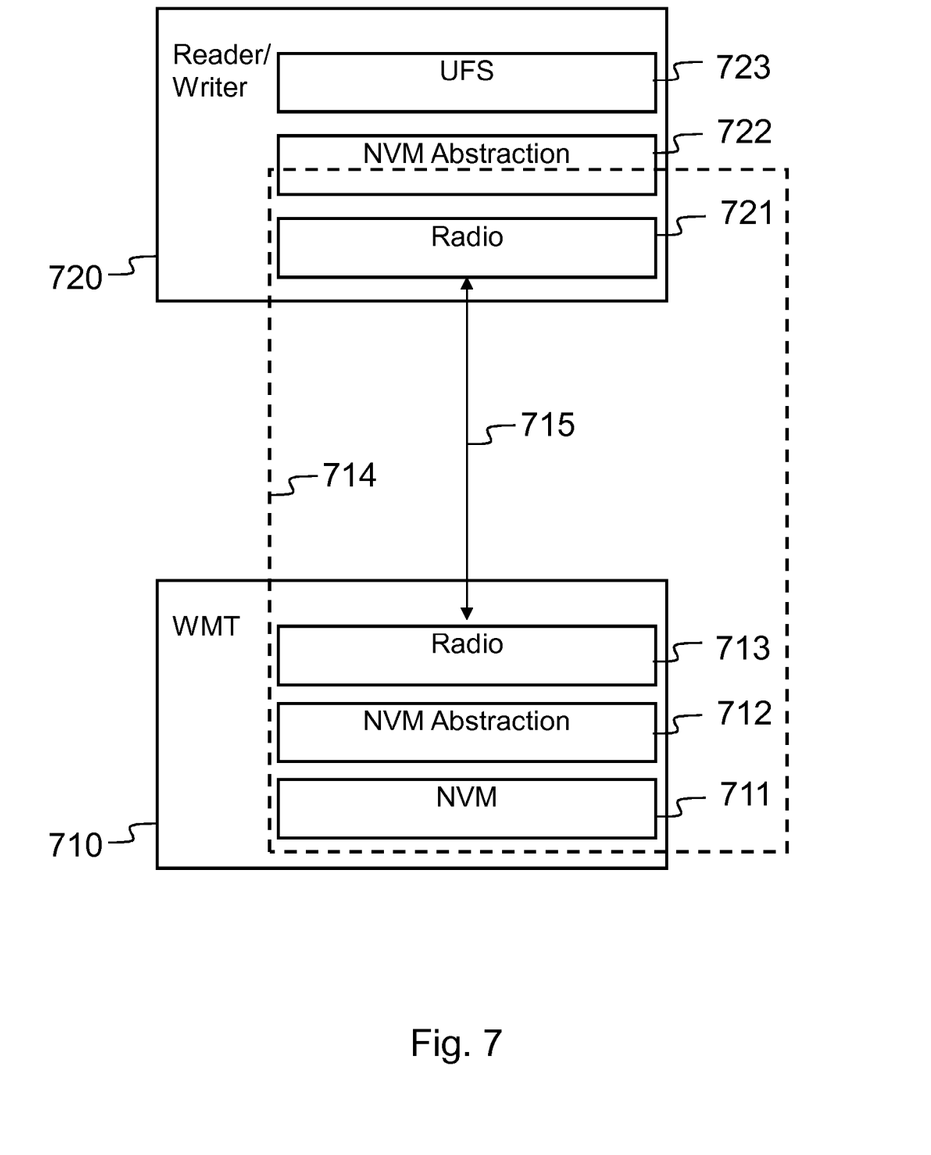
FIG. 7 shows a schematic view of different layers, in which various embodiments of the invention may be applied.

FIG. 7 shows a schematic view of different layers 711-713, 721-723 in which various embodiments of the invention may be applied.

In an embodiment, first data, such as control data, and second data, such as payload data, may be processed differently within layers 711-713, 721-722 as illustrated with the area 714. Selective error correction coding has been applied to data content to produce the first data and the second data, wherein the first data and the second data being coded differently. The first data and the second data are maintained in a non-volatile memory (NVM) 711 of a wireless device, such as a wireless memory tag (WMT) 710. After receiving an electromagnetic signal for powering the wireless device 710, the first and the second data may be communicated from the non-volatile memory (NVM) 711 via and abstraction layer 712 that may be used between a memory portion 711 of the WMT 710 and a radio portion 713 of the WMT 710. Using the radio portion 713 the wireless memory device 710 may transmit the first data and the second data over a short-range wireless link 715 for the apparatus 720 operating as a reader or a writer apparatus. Unequal error protection coding may be have been used for the first data and the second data. The first data may have been forward error correction coded (FEC) using an error correction code (ECC) and the second data may have not been error protection coded at all or with a lighter unequal error protection coding as the first data.

When received by a radio portion 721 of the apparatus 720 the first and the second data may still be separated. Selective error correction decoding is applied to the received first and second data. The received first data is error correction decoded with an error correction code to provide control data. The control data is assumed to be error free and correspond to the control data transmitted from the wireless device 710. The received second data may be not error coded at all and may include some errors. Still within an NVM abstraction layer 722 of the apparatus 720 the first data providing the control data and the second data providing the payload data (possibly with some errors) are merged together to provide data content. The data content corresponds to the original data content from which the first and second data were created for the wireless device 710. The data content merged in layer 722 may comprise a video file format (e.g. H.264/AVC) or other data content that comprises, for example, a correct control part and errors in a payload part. Unequal error correction coding (UEP) applied to the data content may thus be decoded and the first and the second data selectively error correction decoded and merged to the data content.

The merged data content is provided by the abstraction layer 722 for writing to a universal flash storage (UFS) 723. Eventually a user of the apparatus 720 may access the data content, for example view a video stream. The video stream utilizing H.264/AVC may comprise control parts being correct, but in payload data content there may exist some errors, but hardly visible to the user.

Thus, first data, for example a header of a file or a file block, or any critical control data, may be kept separate in all layers 711-713, 721-722 until apparatus mass memory 723 (e.g. 32-128 GB flash memory). Flash memories may thus be used in wireless memory tags (WMT).

In an embodiment, after merging in layer 722 and before storing to the memory 723, selective error correction coding for the data content may be applied.

FIG. 7 shows only some relevant layers 711-713, 721-723 of a wireless device 710 and an apparatus 720 for illustrating various embodiments. However, other layers may be comprised in the device 710 and the apparatus 720 that are not shown.

Various embodiments have been presented. It should be appreciated that in this document, words comprise, include and contain are each used as open-ended expressions with no intended exclusivity.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means or in different combinations of embodiments without deviating from the characteristics of the invention.

Furthermore, some of the features of the above-disclosed embodiments of this invention may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. A passive wireless memory tag comprising:
   a communication interface configured to transceive signals with an apparatus;
   a processor; and
   a memory including a non-transitory storage medium carrying computer program code;
   the memory and the computer program code configured to, with the processor, cause the passive wireless memory tag to:
   receive an electromagnetic signal for powering the passive wireless memory tag;
   apply selective error correction coding to data content to produce first data and second data, wherein a first error protection code is used to produce the first data, and the second data is error correction coded using a second error protection code that is lighter than the first error protection code to save power consumption of the passive wireless memory tag, wherein the first data includes error correction coded high priority or most significant bits of each of a plurality of pixel data of the data content, and the second data includes error correction coded low priority or least significant bits of each of the plurality of the pixel data;
   maintain the first data and the second data in a non-volatile memory of the passive wireless memory tag; and
   transmit the first data and the second data from the passive wireless memory tag over a short-range wireless link to an apparatus.

2. The passive wireless memory tag of claim 1, wherein the non-volatile memory comprises a flash memory.

3. The passive wireless memory tag of claim 1, wherein the first data comprises control data, and the apparatus is a mobile user device.

4. The passive wireless memory tag of claim 3, wherein the second data comprises payload data.

5. The passive wireless memory tag of claim 4, wherein the first data is control data and the second data is payload data.

6. A method comprising:
receiving, by a passive wireless memory tag, an electromagnetic signal for powering the passive wireless memory tag;
applying, by the passive wireless memory tag, selective error correction coding to data content to produce first data and second data, wherein a first error protection code is used to produce the first data, and the second data is error correction coded using a second error protection code that is lighter than the first error protection code to save power consumption of the passive wireless memory tag, wherein the first data includes error correction coded high priority or most significant bits of each of a plurality of pixel data of the data content, and the second data includes error correction coded low priority or least significant bits of each of the plurality of the pixel data;
maintaining the first data and the second data in a non-volatile memory of the passive wireless memory tag; and
transmitting the first data and the second data from the passive wireless memory tag over a short-range wireless link to an apparatus.

7. The method of claim 6, wherein the first data comprises control data, and the apparatus is a mobile user device.

8. The method of claim 7, wherein the second data comprises payload data.

9. The method of claim 8, wherein the payload data comprises at least one of the following:
video data;
image data; and
audio data.

10. The method of claim 8, wherein the first data is control data and the second data is payload data.

11. The method of claim 7, wherein the control data comprises at least one of the following:
control data relating to associated payload data;
identification information for the wireless device or an apparatus;
wireless channel state information;
power control information;
scheduling information;
packet header information;
setup information for the short-range wireless link;
powering information for the wireless device;
error coding information; and
compression information.

12. A non-transitory computer program embodied on a computer readable medium comprising computer executable program code which, when executed by at least one controller of a passive wireless memory tag, causes the passive wireless memory tag to:
receive an electromagnetic signal for powering the passive wireless memory tag;
apply selective error correction coding to data content to produce first data and second data, wherein a first error protection code is used to produce the first data, and the second data is error correction coded using a second error protection code that is lighter than the first error protection code to save power consumption of the passive wireless memory tag, wherein the first data includes error correction coded high priority or most significant bits of each of a plurality of pixel data of the data content, and the second data includes error correction coded low priority or least significant bits of each of the plurality of the pixel data;
maintain the first data and the second data in a non-volatile memory of the passive wireless memory tag; and
transmit the first data and the second data from the passive wireless memory tag over a short-range wireless link to an apparatus.

\* \* \* \* \*